(12) United States Patent
Brenneis et al.

(10) Patent No.: US 12,140,649 B2
(45) Date of Patent: Nov. 12, 2024

(54) METHOD FOR MEASURING PHASE CURRENTS OF A DEVICE UNDER TEST, IN PARTICULAR OF AN INVERTER

(71) Applicant: Robert Bosch GmbH, Stuttgart (DE)

(72) Inventors: Andreas Brenneis, Renningen (DE); Tino Fuchs, Tuebingen (DE); Felix Michael Stuerner, Illerkirchberg (DE); Robert Roelver, Calw-Stammheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/995,494

(22) PCT Filed: Mar. 3, 2021

(86) PCT No.: PCT/EP2021/055252
§ 371 (c)(1),
(2) Date: Oct. 5, 2022

(87) PCT Pub. No.: WO2021/204466
PCT Pub. Date: Oct. 14, 2021

(65) Prior Publication Data
US 2023/0176154 A1    Jun. 8, 2023

(30) Foreign Application Priority Data

Apr. 9, 2020    (DE) .................... 10 2020 204 571.2

(51) Int. Cl.
*G01V 3/00*    (2006.01)
*G01R 33/02*    (2006.01)
(Continued)

(52) U.S. Cl.
CPC ....... *G01R 33/323* (2013.01); *G01R 33/0206* (2013.01); *G01R 33/032* (2013.01)

(58) Field of Classification Search
CPC .................... G01R 33/323; G01R 33/0206
(Continued)

(56) References Cited

U.S. PATENT DOCUMENTS

| | | |
|---|---|---|
| 2013/0229173 A1 | 9/2013 | Bertrand |
| 2015/0002137 A1 | 1/2015 | Patel et al. |

(Continued)

FOREIGN PATENT DOCUMENTS

| | | | | |
|---|---|---|---|---|
| CN | 102762682 A | * | 10/2012 | ......... B29C 65/3612 |
| CN | 108303461 A | * | 7/2018 | |

(Continued)

OTHER PUBLICATIONS

International Search Report corresponding to PCT Application No. PCT/EP2021/055252, mailed Jul. 7, 2021 (German and English language document) (6 pages).

(Continued)

*Primary Examiner* — Walter L Lindsay, Jr.
*Assistant Examiner* — Frederick Wenderoth
(74) *Attorney, Agent, or Firm* — Maginot, Moore & Beck LLP

(57) ABSTRACT

A method is for measuring phase currents of a device under test, in particular of an inverter, in which a sensor arrangement, which has a component including a crystal lattice with a defect, is arranged in a region of the device under test. The method includes using the sensor arrangement to detect a magnetic field formed by a vector of magnetic fields, the magnetic fields each in turn being brought about by one of the phase currents of the device under test, and calculating a vector of the phase currents from the vector of the magnetic fields based on a coefficient matrix.

10 Claims, 8 Drawing Sheets

(51) Int. Cl.
*G01R 33/032* (2006.01)
*G01R 33/32* (2006.01)

(58) Field of Classification Search
USPC .......................................................... 324/301
See application file for complete search history.

(56) References Cited

U.S. PATENT DOCUMENTS

2016/0146904 A1  5/2016  Stetson, Jr. et al.
2019/0154766 A1  5/2019  Lutz et al.

FOREIGN PATENT DOCUMENTS

| CN | 108732143 A | * | 11/2018 | ............... G01K 1/00 |
| DE | 10 2015 208 151 A1 | | 11/2016 | |
| DE | 10 2018 116 616 A1 | | 1/2020 | |
| EP | 3091486 A2 | * | 11/2016 | ......... G06K 9/00362 |
| JP | H0712976 U | * | 3/1995 | |
| WO | WO-2005030330 A1 | * | 4/2005 | ......... A61B 17/2256 |
| WO | WO-2009103938 A1 | * | 8/2009 | ......... A61B 1/00156 |

OTHER PUBLICATIONS

Bourgeois et al., "Enhanced photoelectric detection of NV magnetic resonances in diamond under dual-beam excitation", Physical Review B., vol. 95, No. 4, Jan. 17, 2017 (5 pages).

* cited by examiner

METHOD FOR MEASURING PHASE CURRENTS OF A DEVICE UNDER TEST, IN PARTICULAR OF AN INVERTER

This application is a 35 U.S.C. § 371 National Stage Application of PCT/EP2021/055252, filed on Mar. 3, 2021, which claims the benefit of priority to Serial No. DE 10 2020 204 571.2, filed on Apr. 9, 2020 in Germany, the disclosures of which are incorporated herein by reference in their entirety.

The disclosure relates to a method for measuring phase currents of a device under test, in particular an inverter, and to an arrangement for carrying out the method.

BACKGROUND

An inverter, sometimes referred to as a three-phase converter, is an electrical device that converts a DC voltage into an AC voltage.

One application of inverters is as a central assembly in electric vehicles.

Inverters are used in battery or fuel cells as electrical energy storage units. In these devices, inverters convert a DC voltage of an energy storage unit into alternating current for the drive of an electric motor.

Currently available drive designs are based on three-phase inverters, which can provide the motor with a three-phase alternating current with variable frequency and voltage. For regulating the electric drive, it is important to know exactly the individual currents in the individual phases of the electric motor. Currents of up to 1000 A can occur. The current or current strength of the individual phases is measured using known methods via e.g. shunt resistors at the output of the inverter, wherein the voltage drop across the shunt resistor divided by the size of the shunt resistor is equal to the current in the phase. However, this has the disadvantage that the current through the shunt resistor also causes power to be consumed at this point, which reduces the efficiency of the electric drive. In addition, it is difficult and/or expensive to implement shunt resistors that are stable over the long term. For this reason, it is becoming increasingly common to use magnetic field sensors to determine the current in the phase via the associated magnetic field. This method uses the Biot-Savart law. For a given geometrical arrangement, the strength of the magnetic field at the location of the sensor is proportional to the current through the conductor. For this purpose, sensors based on the Hall effect or GMR effect (GMR: Giant Magnetoresistance) are usually used.

It is to be expected that the requirement on the accuracy of the current measurement in the inverter will shift from its current value of approximately 0.5% full scale, or approximately 3% of the measured value, to significantly lower values, as the error in the current also means an inaccuracy in the drive torque. At present, the existing accuracy requirements on the current measurement with Hall, GMR and TMR sensors (TMR: Tunnel Magnetoresistance) can only be met by using flux concentrators for the magnetic fields of the phase currents. One such flux concentrator, also known as a C-ring, must be provided for each phase of the inverter output. These C-rings are not only very expensive but they also limit the achievable size of the inverters due to their geometric dimensions. Reference is made to FIG. 1 in this context.

Document DE 10 2015 208 151 A1 describes a method for measuring an electrical current, wherein this current gives rise to a magnetic field. In the method, a diamond material that has at least one nitrogen incorporation with an adjacent defect is exposed to this magnetic field. In this way, the diamond material is excited to fluorescence, the intensity of which is detected and evaluated.

SUMMARY

Against this background, a method and a sensor arrangement are presented. Various embodiments are obtained from the dependent claims and the description.

The presented method is used for measuring phase currents of a device under test, in this case in particular an inverter. The method is in principle also suitable for measuring phase currents in other objects under test, i.e. applications or electrical circuits. Such test objects or applications or electrical circuits within the meaning of the present disclosure may also be, for example, other energy transformers or energy converters in which multi-phase current and/or multi-phase voltage is available or provided as an input variable and/or as an output variable.

The disclosure is therefore not limited to inverters, but is described here and in the following based on an inverter. In the method, a sensor arrangement that contains a component comprising a crystal lattice with a defect, for example an NV defect or an NV center, is arranged in the region of the inverter. The sensor arrangement is used to detect a magnetic field formed by a vector of magnetic fields, which in turn are induced by one of the phase currents of the inverter. A vector of the phase currents is then calculated from the vector of the magnetic fields by means of a coefficient matrix.

It is advisable to position the sensor arrangement at approximately the same distance to the three phases of the inverter, as this enables particularly accurate results to be achieved.

It has thus been recognized that, in contrast to known methods, the use of C-rings can be avoided by using an alternative technology for sensitive and precise measurement of magnetic fields and the accuracy of the current measurement at the inverter output can be increased at the same time.

By using the high-sensitivity electro-optical magnetometry described above with NV centers in a component, e.g. a diamond, a much more accurate measurement of the current strength in the individual phases of an inverter for driving a three-phase motor can be achieved than is currently possible.

Thus, an embodiment is presented of the use of a single diamond with an NV-center or NV-centers in the diamond for simultaneously measuring the currents of all three phases in the output of an inverter. The diamond is typically mounted or positioned at a location that is approximately the same distance from the phase busbars of the inverter. An ODMR measurement (optically detected magnetic resonance) of the electron spin resonance is used to determine the vector of the magnetic flux density at the location of the diamond. From the size of the three vector components, the triple of the phase currents is determined by solving a linear system of equations from the set of the B-field components. In the ODMR, the detection is performed in the optical frequency range and not at the actual resonance frequency.

In comparison to known methods, it is no longer necessary to integrate one sensor per phase, instead only one sensor is required for the entire inverter. In addition, it is no longer necessary to provide a flux concentrator for each phase, as the magnetometry with NV centers in the diamond is already sufficiently sensitive to satisfy the latest accuracy requirements on the current measurement. Furthermore, the solution presented has the advantage of having reserves for future, more stringent accuracy requirements.

The sensor arrangement presented and the method described therefore use a magnetometer which is configured to detect a magnetic signature and hence a magnetic field.

A magnetic field is a vector field that describes the magnetic influence of electric charges in relative motions and magnetized materials. Magnetic fields can be caused, for example, by magnetic materials, electrical currents, and temporal variations of an electrical field.

A magnetic field can be described using different variables. For example, the magnetic flux density, also known as magnetic induction, is physical variable a of electrodynamics that describes the density per unit area of the magnetic flux that passes perpendicularly through a particular surface element. The magnetic flux density is a directed quantity, i.e. a vector.

The magnetic field strength H is another variable that describes the magnetic field. This is related to the magnetic flux density B via the relationship:

$$B = \mu * H,$$

where $\mu$ is the magnetic permeability.

In order to detect a magnetic field, it is necessary to capture a variable that describes this magnetic field. For example, a measuring device can be used that detects a variable of the magnetic field, such as the magnetic flux density or the magnetic field strength, and assigns a value to the detected variable. Such a measuring device typically comprises a sensor unit and an evaluation unit.

The sensor arrangement is configured to detect the variable which is used to describe the magnetic field and thus represents this magnetic field. The sensor unit comprises at least one highly sensitive magnetometer that has a high dynamic range and allows vectorial detection of the magnetic field.

Further advantages and embodiments of the disclosure are derived from the description and the attached drawings.

The aforementioned features and those yet to be explained below can be applied not only in the corresponding specified combination, but also in other combinations or in isolation without departing from the scope of the present disclosure.

DETAILED DESCRIPTION

Figure 1:
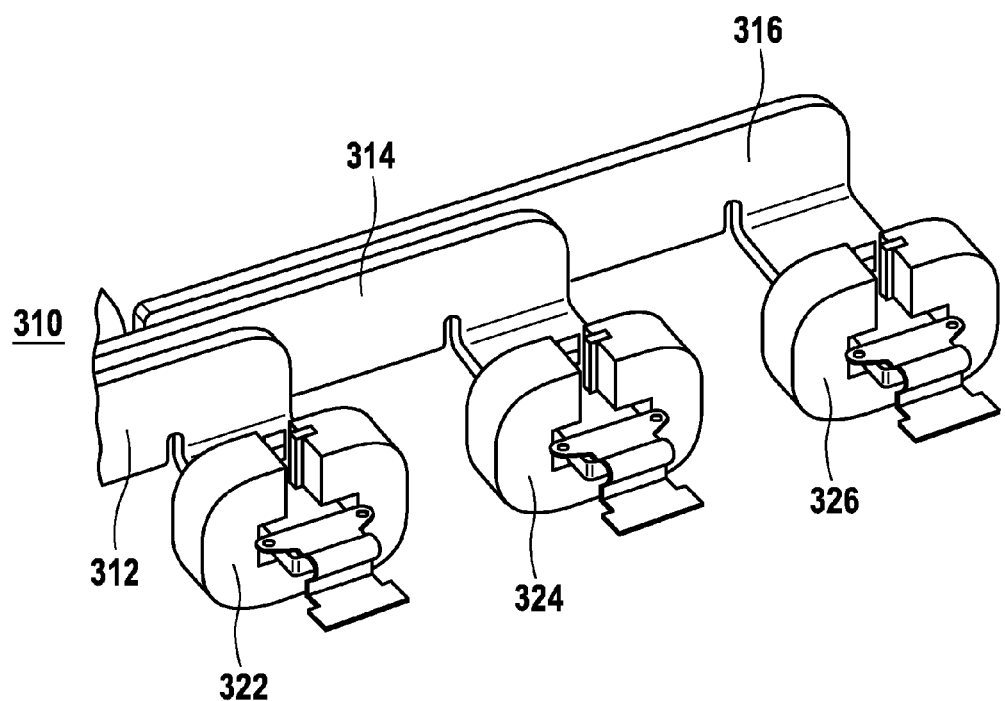
FIG. 1 shows busbars of three phases at an output of an inverter.

The disclosure is illustrated schematically in the drawings by reference to embodiments and is described in detail below with reference to the drawings.

FIG. 1 shows a perspective view of three busbars at the output of an inverter 310, namely a first busbar 312, a second busbar 314 and a third busbar 316. A first C-ring 322 is assigned to the first bus bar, a second C-ring 324 to the second bus bar 314, and a third C-ring 326 to the third bus bar 316. The C-rings 322, 324, 326 act as flux concentrators.

The method presented uses a magnetic field sensor in the following. An example of a magnetic field sensor is a magnetometer. This is a sensing device for measuring magnetic flux densities. Magnetic flux densities are measured in the Tesla (T) unit. Common magnetometers are, for example, Hall sensors, Förster probes, proton magnetometers, Kerr magnetometers, and Faraday magnetometers.

Figure 2:
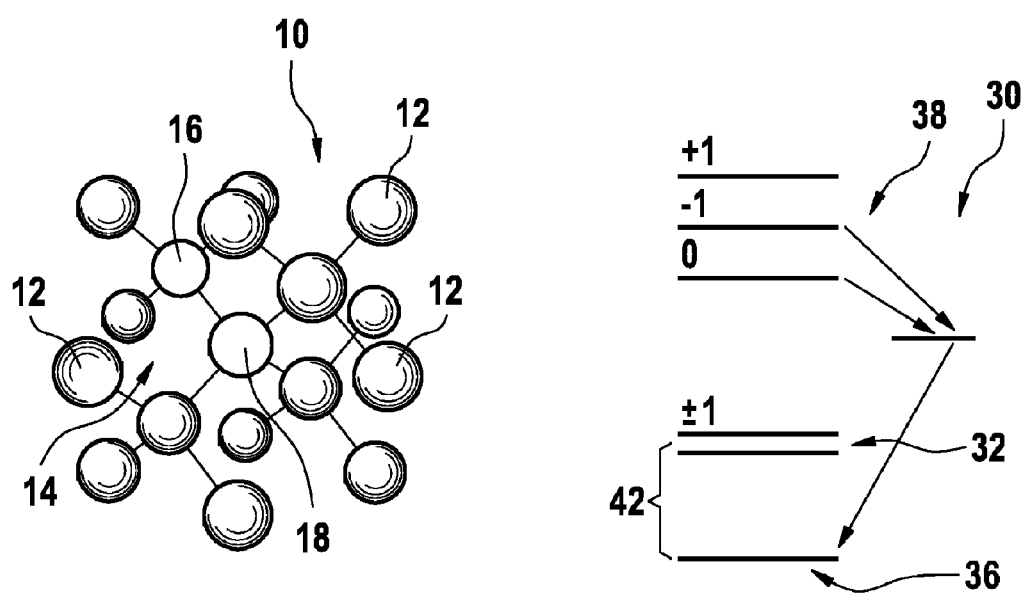
FIG. 2 shows nitrogen defects (NV centers) in a diamond.

In addition to these types of magnetometer, it is also known to use diamonds, in the lattices of which defects or discontinuities are provided, which show a detectable behavior depending on an applied magnetic field. In these, a negatively charged color center consisting of nitrogen and a defect (nitrogen vacancy center, NV center) in a diamond is used for highly sensitive measurements of magnetic fields, electrical fields, mechanical stresses, and temperatures. Reference is made to FIG. 2 in this context.

The left-hand side of FIG. 2 shows a crystal lattice, in this case a diamond, the crystal lattice as a whole being designated by reference number 10. The crystal lattice 10 comprises a number of carbon atoms 12 and an NV center 14, which in turn has one nitrogen atom 16 and an adjacent defect or vacancy 18. The nitrogen defect 14 is aligned along one of the four possible bond directions in the diamond crystal.

On the right hand side, the energy level diagram 30 of the negatively charged NV center 14 is shown. A ground state $^3A_2$ 32 is a spin triplet with total spin s=1. The states 34 with magnetic spin quantum number $m_s=+-1$ are energetically shifted compared to state 36 with $m_s=0$. A state $^3E$ 38 and an intermediate state 40 are also shown. A microwave frequency of 2.87 GHz, corresponding to a splitting energy or zero-field splitting $D_{gs}$, is shown in the bracket 42. The zero-field splitting is an intrinsic variable that is independent of the irradiated MW field or the MW frequency. It is approximately 2.87 GHz and is, in particular, temperature-dependent. The following relationship applies to the determination of the resonance frequency:

$$v_\pm \approx D_{gs} + \beta * \Delta T \pm y_{NV} * B_0;$$

where $\Delta T$ indicates the deviation from room temperature, $\beta$ the temperature-induced shift of the zero-field splitting with $\beta$ approximately −74.2 kilohertz/Kelvin, $y_{NV}$ is the gyromagnetic ratio of the NV center, and $B_0$ is the field strength of an external magnetic field.

The quantum technologies used in the magnetic field sensors presented offer crucial advantages over classical sensor principles, which underline the disruptive potential of quantum technology. With nitrogen defects, the following specific advantages are obtained:

ultra-high sensitivities (1 pT/√Hz), vector magnetometry, i.e. a direction determination of the magnetic field is possible, high measurement range (>1 Tesla), linearity (Zeeman effect), no degradation, as the measurement is based on quantum mechanical states, similar to those in the hydrogen atom, where the Rydberg constant is a fixed energy which is a constant for all atoms independent of location and time, it is possible to determine external magnetic fields vectorially at the same time based on the four possible spatial directions of the NV axes present in the diamond.

Figure 3:
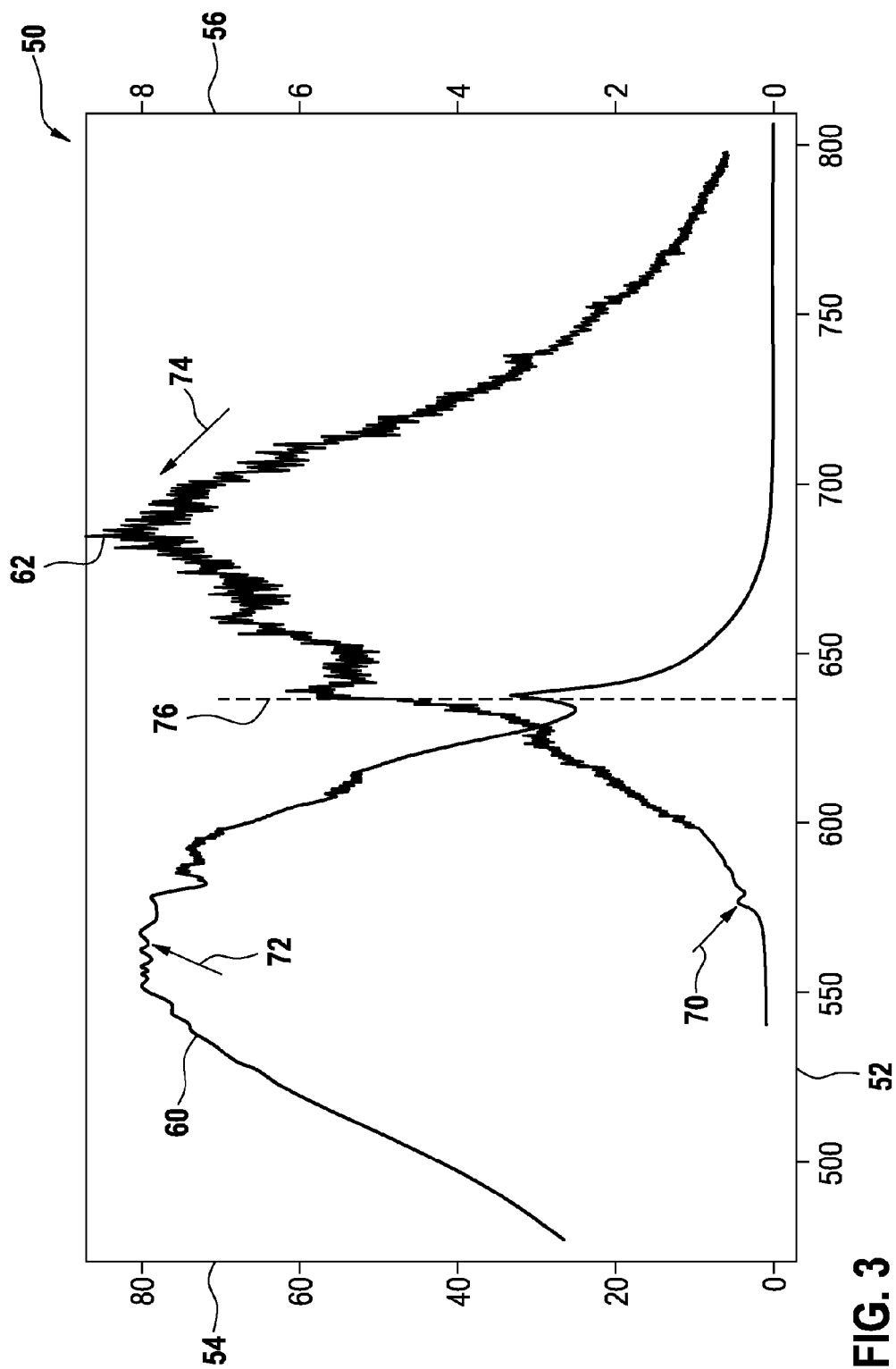
FIG. 3 shows an absorption and emission spectrum of the NV center.

In order to read out a sensor based on NV centers, the magnetic resonance of the triplet of the ground state is optically detected, see $^3$A state in FIG. 2 (ODMR, optically detected magnetic resonance). To do this, the NV center must be excited with green light. Reference is made to FIG. 3.

FIG. 3 shows a graph 50 of the absorption and emission spectrum of the NV center which is shown in FIG. 2. In the graph 50, the wavelength [nm] is plotted on an abscissa 52, the absorption coefficient [cm$^{-1}$] is plotted on a first ordinate 54, and the fluorescence is plotted on a second ordinate 56. A first curve 60 shows the absorption spectrum, a second curve 62 shows the emission spectrum. A first arrow 70 indicates NV$^0$ ZPL, a second arrow 72 indicates NV absorption, and a third arrow 74 indicates NV-fluorescence. Furthermore, NV-ZPL 76 at 637 nm is shown.

Figure 4:
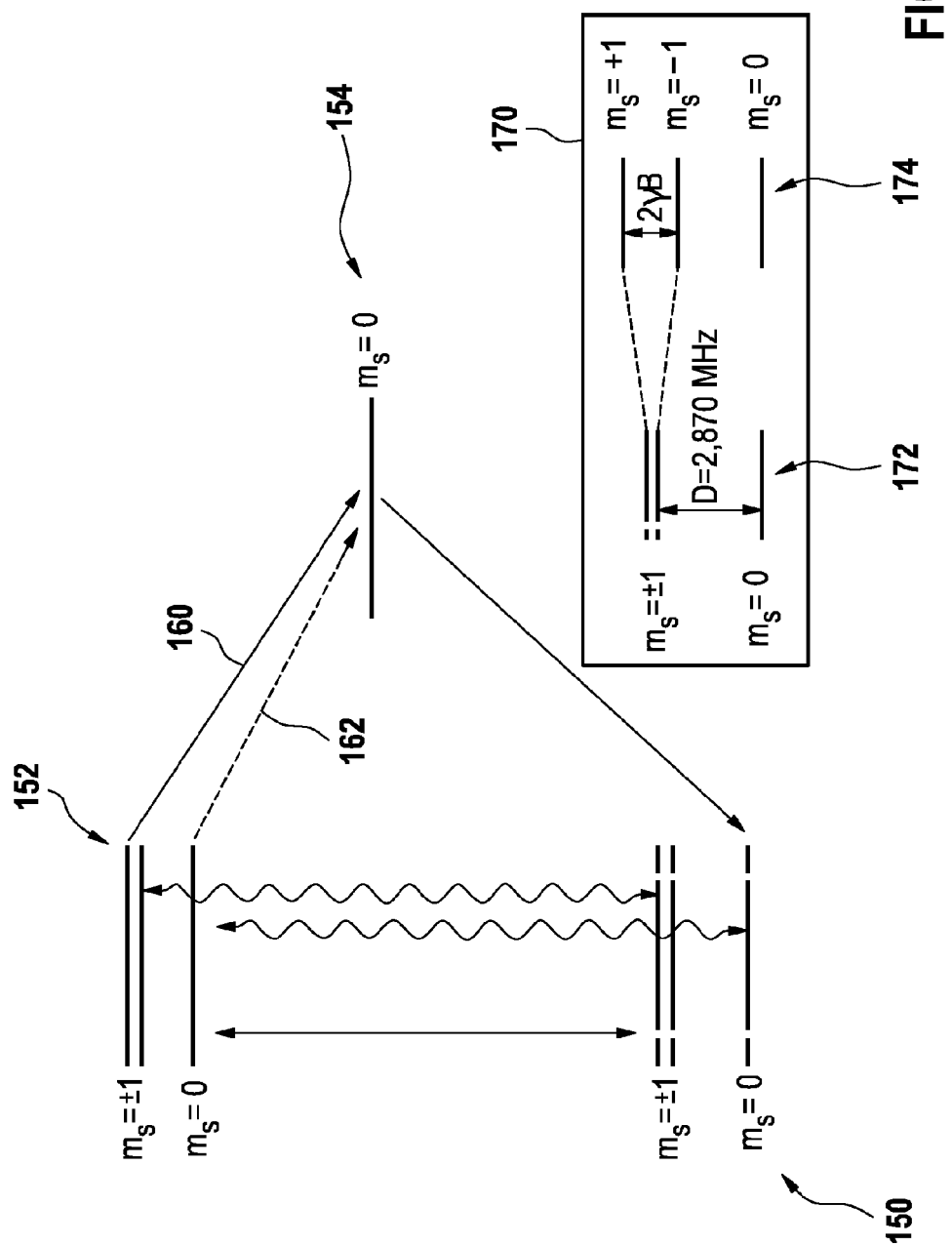
FIG. 4 shows the Zeeman effect within the energy diagram of the negatively charged NV center.

FIG. 4 shows the Zeeman effect in the ground state 150 of the NV center. The excited state 152 and the intermediate state 154 are also entered. A first arrow 160 shows a transition with a high probability or transition rate, a dashed arrow 162 shows a transition with a low probability or transition rate. A box 170 shows a transition 172 without a magnetic field and a transition 174 with a magnetic field.

Figure 5:
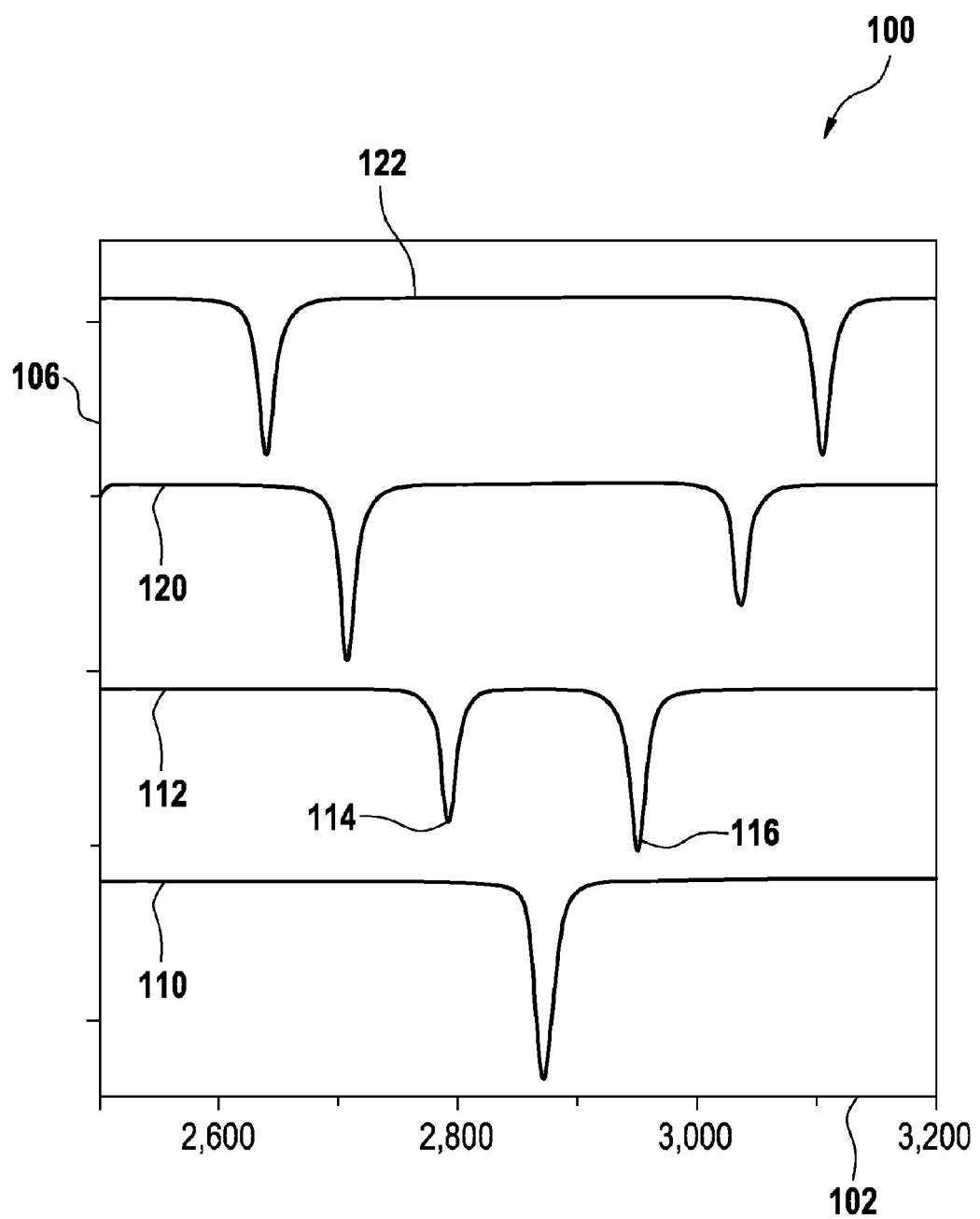
FIG. 5 shows an optically detected magnetic resonance of a single NV center.

FIG. 5 shows in a graph 100 the optically detectable magnetic resonance (ODMR) of a single NV center for various background magnetic fields. In the graph 100, the microwave frequency is plotted on an abscissa 102 and the fluorescence is plotted on an ordinate 106.

A first curve 110 shows the resonance at B=0, a second curve 112 shows the resonance at B=2.8 mT with the negative peaks $\omega_1$ 114 and $\omega_2$ 116, a third curve 120 shows the resonance at B=5.8 mT and a fourth curve 122 shows the resonance at 8.3 mT.

Figure 6:
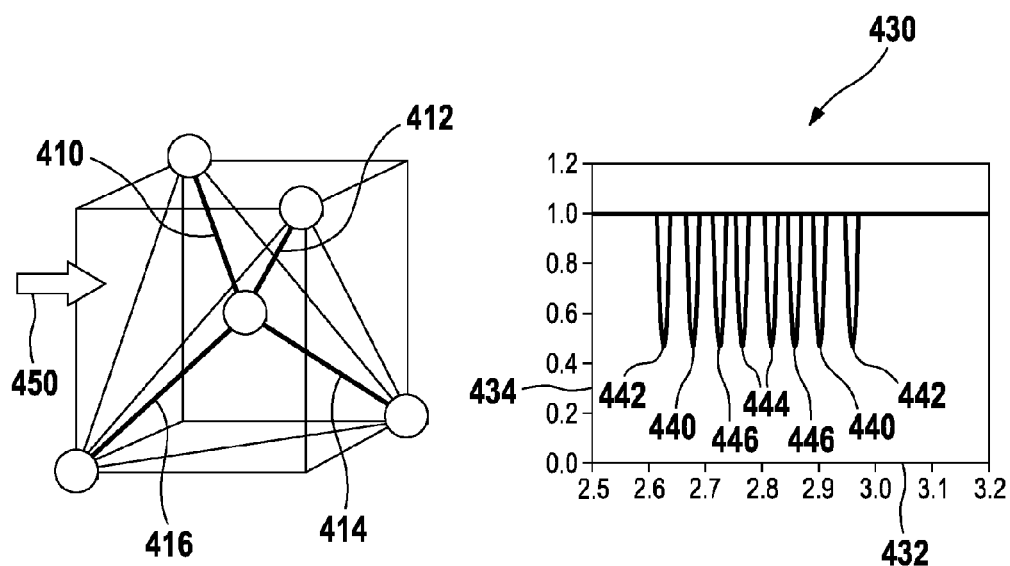
FIG. 6 shows a crystal unit cell.

FIG. 6 shows a crystal unit cell of diamond, which is labeled as a whole with the reference number 400. The diagram shows a nitrogen atom in the center and the four nearest lattice sites. A vacancy is located at one of these lattice sites, while the other three are occupied by C-atoms. The four possible positions of the vacancy span the space of the four possible directions of the NV center, which are called bonds in the following. There is a first bond a 410, a second bond b 412, a third bond c 414, and a fourth bond d 416. An arrow 450 depicts the magnetic field B.

On the right-hand side a graph 430 is shown in which the microwave frequency [GHz] is plotted on the abscissa 432 and the fluorescence [arb. units] is plotted on the ordinate 434. The graph 430 shows fluorescence dips, a first dip 440 for the first bond a 410, a second dip 442 for the second bond b 412, a third dip 444 for the third bond c 414, and a fourth dip 446 for the fourth bond d 416.

In this unit cell 400, the NV center 404 has four possible ways of arranging itself in the crystal. Since the angle between the magnetic field direction and crystal axis is different for each crystal axis, different degrees of frequency splits occur in the NV centers, depending on the respective crystal direction. This results in up to four associated pairs of fluorescence dips in the fluorescence spectrum, as can be seen on the right-hand side of graph 430. By evaluating the resonance frequency for each crystal direction, the magnetic field direction and strength can be extracted.

Figure 7:
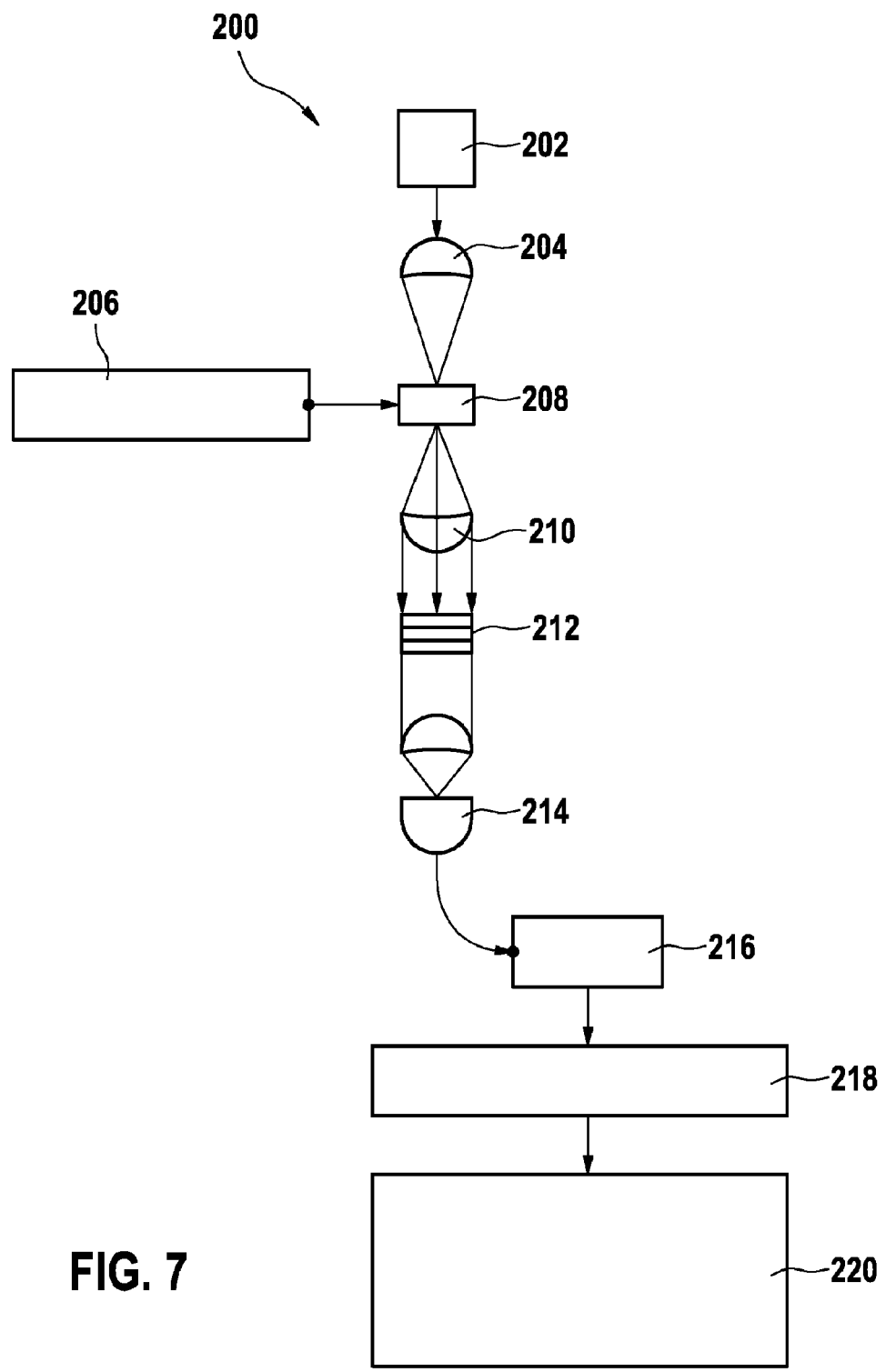
FIG. 7 shows a schematic view of the components required for the sensor unit in one embodiment.

FIG. 7 shows a schematic diagram of the components required for the excitation and readout of a magnetometer with a diamond/NV-based sensor arrangement, which is designated as a whole with reference number 200. The illustration shows a laser source 202. Alternatively, an LED can also be used. Also shown are a lens 204, a microwave source 206, a diamond 208 with NV defects, a further lens 210, a long-pass filter (LP) 650 nm 212, a photodetector 214, an analog-to-digital converter 216, and a signal processor 218 which outputs an output 220 with magnetic field, temperature, pressure. For example, the long-pass filter 212 is a distributed Bragg reflector and ensures that the green excitation light is blocked and thus does not strike the photodetector 214. On the other hand, the long-pass filter 212 allows the fluorescent light emitted in the wavelength range >650 nm, i.e. 650-800 nm, to pass.

The fluorescent light, red-shifted with respect to the excitation light, see FIG. 3, shows a characteristic dip in the energetic position of the electron spin resonance irradiation under additional by an alternating electromagnetic field (microwave), see FIG. 5. Due to the Zeeman effect, see FIG. 4, the position is linearly dependent on the magnetic field, see FIG. 5. This allows a highly sensitive magnetic field sensor to be constructed. FIG. 7 shows all the required components of a color-center-based magnetometer in schematic form.

Since the NV center in the single-crystalline diamond has four possible ways of arranging itself in the crystal lattice, see FIG. 6, the presence of a directed magnetic field leads causes the NV centers present in the crystal to react to the external magnetic field to different degrees depending on their position in the crystal, i.e. the projection of the magnetic field onto the NV axis is different. This means that in the maximum case four associated pairs of fluorescence minima can appear in the spectrum, from the position of which in the spectrum the magnitude and direction of the magnetic field can be uniquely determined.

In order to be able to obtain vector information even in the case of weak external magnetic fields, suitable technical measures should be taken to ensure that the contributions of all four possible NV orientations in the diamond crystal can be distinguished in the ODMR spectrum even without a magnetic field acting externally on the sensor. This can be effected by a static magnetic bias field, which is provided within the sensor by appropriate technical measures. However, this bias field should have a field strength that is as homogeneous as possible within the sensitive diamond volume, as inhomogeneities of the bias field affect the sensitivities of the sensor.

The sensitivity of a diamond magnetometer is calculated as:

$$\eta = \delta B \sqrt{\Delta t} = \frac{\sqrt{I_0}}{(\partial I/\partial B)} \approx \frac{h}{g\mu_B} \frac{\Delta v}{C\sqrt{I_0}}$$

The input parameters include a noise signal, which in optical sensors is equal to the photon shot noise as a physical limit, as well as the gyromagnetic ratio $\eta_{NV}$, i.e. a material constant, the intensity $I_0$ of the fluorescence, the contrast C of the ODMR (contrast) and the line width $\Delta v$, the FWHM of the optically detectable resonance.

Since in the sensitive diamond volume any deviation of the bias field from its target value would lead to a different position of the magnetic resonance, a bias-field gradient in the diamond volume leads to a broadening of the resonance and thus a deterioration of the sensitivity.

For effective splitting of the four NV orientations the strength of the bias field should be between 100 µT and 10 mT, ideally around 1 mT. In order to enable a sensitivity of 1 pT/√Hz, the bias field must not deviate from the target value by more than 1 per mill in the region of the diamond volume, i.e. for 1 mT by a maximum of 1 µT.

Figure 8:
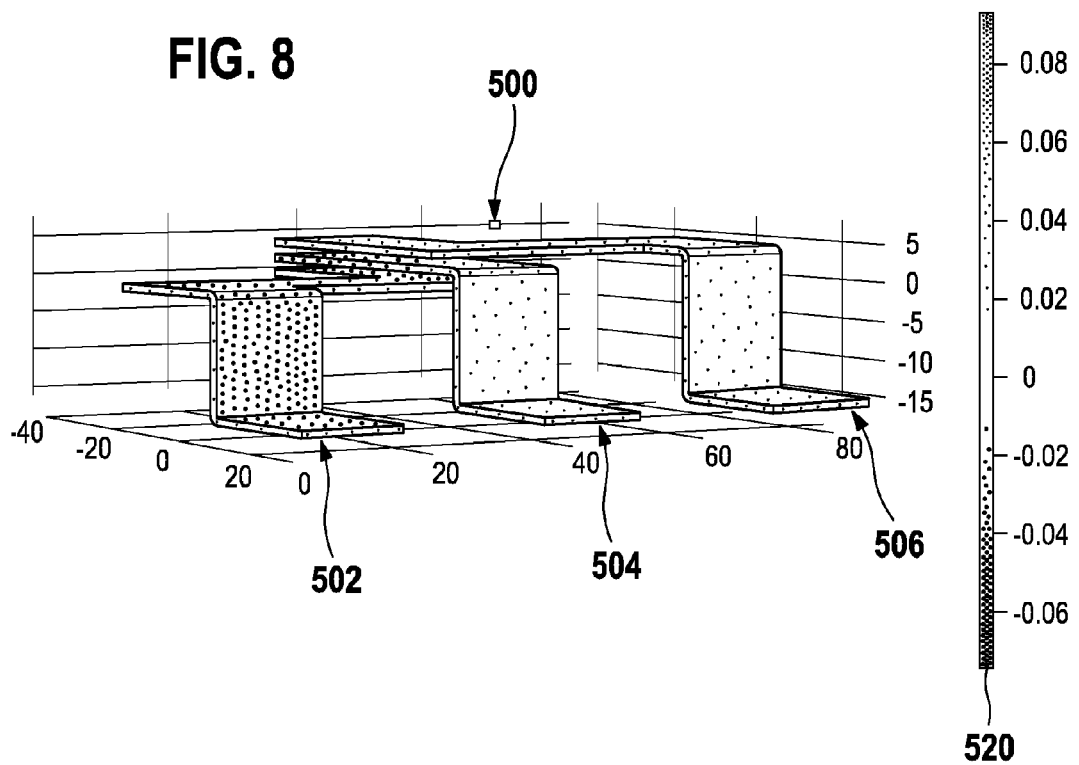
FIG. 8 shows busbars of three phases at an output of an inverter.

The method presented uses a vector magnetometer based on an ODMR measurement at NV centers in a diamond, which is typically positioned at approximately the same distance to the three phase conductors of an inverter. Reference is made to FIG. 8.

FIG. 8 shows busbars of the three phases at the output of an inverter with a diamond with NV centers for measuring the vector magnetic field that results from the current flows of the phases. The diagram shows a diamond 500, a first conductor 502 for phase 1, a second conductor 504 for phase 2, and a third conductor 506 for phase 3.

Reference number 520 shows a surface plot of the By component of the magnetic flux density in Tesla, which is induced by the three phase currents, namely $I_1$=1000 A, $I_2$=−500 A, $I_3$=−500 A.

From the linear relationship between the electric current and the magnetic flux density induced thereby on the one hand, and the linear superposition of the magnetic fields of individual current elements on the other, the linear relationship specified in (1) between the vector of the phase currents and the vector of the magnetic flux density is obtained, which is conveyed by the matrix of the coefficients $b_{ij}$. If the coefficient matrix is known, the vector of the phase currents can be calculated by multiplying B by the inverse matrix, as indicated in (2).

$$\vec{B} = \begin{pmatrix} B_x \\ B_y \\ B_z \end{pmatrix} = \begin{pmatrix} b_{11} & b_{12} & b_{13} \\ b_{21} & b_{21} & b_{23} \\ b_{31} & b_{32} & b_{33} \end{pmatrix} \times \begin{pmatrix} I_1 \\ I_2 \\ I_3 \end{pmatrix} \quad (1)$$

$$\begin{pmatrix} I_1 \\ I_2 \\ I_3 \end{pmatrix} = \begin{pmatrix} b_{11} & b_{12} & b_{13} \\ b_{21} & b_{22} & b_{23} \\ b_{31} & b_{32} & b_{33} \end{pmatrix}^{(-1)} \times \begin{pmatrix} B_x \\ B_y \\ B_z \end{pmatrix} \quad (2)$$

The coefficients $b_{ij}$ are determined according to the method by calibration after the diamond with NV centers is placed at the output of the inverter at an approximately equal distance to the three busbars in the manner described above.

$$\begin{pmatrix} B_x \\ B_y \\ B_z \end{pmatrix} = \begin{pmatrix} b_{1j} \times I_j \\ b_{2j} \times I_j \\ b_{3j} \times I_j \end{pmatrix} \quad (3)$$

$$\begin{pmatrix} b_{1j} \\ b_{2j} \\ b_{3j} \end{pmatrix} = \begin{pmatrix} B_x/I_j \\ B_z/I_j \\ B_z/I_j \end{pmatrix} \quad (4)$$

For this purpose, only one phase is supplied with current at a time, while no current flows in the other two phases. With j as the index of the energized phase, equation (3) then applies, or (4) after solving for $b_{1j}$, $b_{2j}$ and $b_{3j}$. By means of three calibration measurements, j=1, 2, 3, all nine coefficients of $b_{ij}$ are therefore known. These calibration coefficients are stored in the sensor and used to calculate the individual currents of the three phases of the inverter ($I_1$, $I_2$, $I_3$) from the vector magnetic field B measured in the diamond by ODMR using equation (2).

Figure 9:
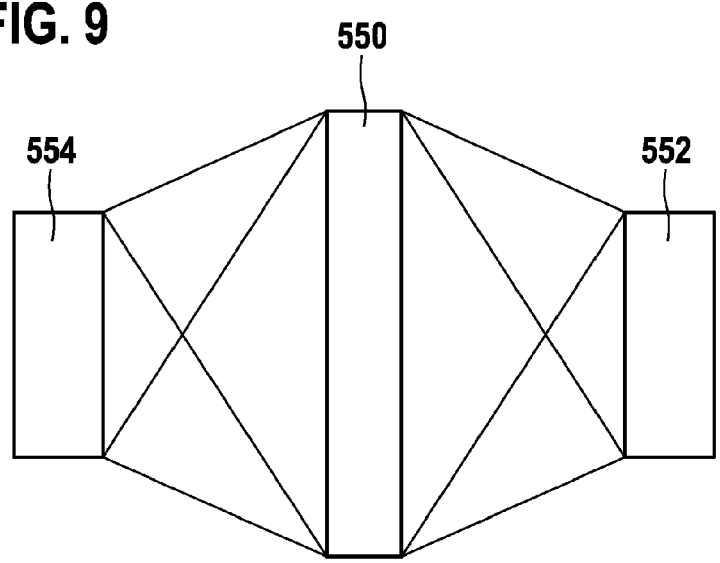
FIG. 9 shows a neural network for predicting currents.

As an alternative to the procedure described here, the coefficients $b_{ij}$ can also be determined as part of the calibration by determining the vector of the magnetic flux density $B_x$, $B_y$, $B_z$ for a plurality of arbitrary triples $I_1$, $I_2$, $I_3$ and training a neural network on the basis of this data, which then determines the existing triple of the currents through the phases of the inverter from the measured vector of the magnetic flux density $B_x$, $B_y$, $B_z$ when the sensor is applied in the field. Reference is made to FIG. 9.

FIG. 9 shows a neural network 550 for predicting the currents through the three phases of the inverter 552, namely $I_1$, $I_2$, $I_3$, from the vector components of the magnetic flux densities, namely $B_x$, $B_y$, $B_z$, at the position of the diamond 554 with NV centers.

Another component of at least one embodiment of the presented method is the measurement of the magnetic field in the diamond with NV centers based on the photoelectric detection of the magnetic resonance (PDMR) of the NV centers in diamond. PDMR measures an electrical current, a photocurrent, instead of measuring the intensity of the fluorescent light. For this purpose, for example, an electrode structure consisting of an electrode and a counter electrode is applied on one side of the diamond, e.g. in the form of an interdigital structure made of a conductive material, e.g. metal. When an electrical voltage is applied, a photoelectric current flows when the diamond is excited with green light. If the microfield acting simultaneously on the diamond hits a magnetic resonance of the NV centers at approximately 2.87 GHz, plus or minus the frequency splitting by the magnetic field and the Zeeman effect, then the photocurrent collapses. The resonance can be determined from the measurement of the photocurrent and the magnetic field can be determined by means of the gyromagnetic ratio of the NV center.

The invention claimed is:

1. A method for measuring phase currents of a device under test in which a sensor arrangement is arranged in a region of the device under test, the method comprising:
    using the sensor arrangement to detect a magnetic field formed by a vector of a plurality of magnetic fields, each magnetic field of the plurality magnetic fields induced by a corresponding phase current of a plurality of phase currents of the device under test;
    determining the vector of the plurality of magnetic fields based on the detected magnetic field; and
    calculating a vector for each phase current of the plurality of phase currents based on the determined vector of the plurality of magnetic fields and a coefficient matrix,
    wherein the sensor arrangement includes a component comprising a crystal lattice with at least one defect configured to generate an output corresponding to the detected magnetic field,
    wherein the device under test is a three-phase inverter,
    wherein the three-phase inverter is operably connected to an electric motor, and
    wherein the three-phase inverter is operated based on the calculated vector for each phase current in order control a drive torque of the electric motor.

2. A sensor arrangement for measuring phase currents of a device under test, the sensor arrangement comprising:
    a component defining a crystal lattice with at least one defect, the component arranged in a region of the device under test; and
    a processor operably connected to the component, the processor configured to (i) detect a magnetic field formed by a vector of a plurality of magnetic fields, each magnetic field of the plurality of magnetic fields induced by a corresponding phase current of a plurality of phase currents of the device under test, (ii) determine the vector of the plurality of magnetic fields based on the detected magnetic field, and (iii) calculate a vector for each phase current of the plurality of phase currents based on the determined vector of the plurality of magnetic fields and a coefficient matrix, wherein the at least one defect is configured to generate an output corresponding to the detected magnetic field, wherein the device under test is a three-phase inverter, wherein the three-phase inverter is operably connected to an electric motor, and wherein the three-phase inverter is operated based on the calculated vector for each phase current in order control a drive torque of the electric motor.

3. The method as claimed in claim 1, wherein the plurality of phase currents includes three phases and the method further comprises:

positioning the sensor arrangement at approximately the same distance to each of the three phases of the device under test.

4. The method as claimed in claim 1, wherein the output of the at least one defect has a fluorescent effect and the method further comprises:

detecting the magnetic field using an optically detected magnetic resonance ("ODMR").

5. The method as claimed in claim 1, wherein the output of the at least one defect induces a magnetic resonance and the method further comprises:

detecting the magnetic field using a photoelectric detection of the magnetic resonance ("PDMR") measurement.

6. The method as claimed in claim 1, further comprising: determining the coefficient matrix using a calibration.

7. The method as claimed in claim 1, further comprising: determining the coefficient matrix using a trained neural network.

8. The sensor arrangement as claimed in claim 2, wherein the crystal lattice is a diamond.

9. The sensor arrangement as claimed in claim 8, wherein the at least one defect is formed as a nitrogen defect or a nitrogen-vacancy center ("NV center").

10. The sensor arrangement as claimed in claim 2, further comprising:

at least one microwave source.

* * * * *